United States Patent [19]
Ozawa et al.

[11] Patent Number: 5,810,538
[45] Date of Patent: Sep. 22, 1998

[54] SEMICONDUCTOR MANUFACTURING EQUIPMENT AND METHOD FOR CARRYING WAFERS IN SAID EQUIPMENT

[75] Inventors: Makoto Ozawa; Mitsuhiro Hirano, both of Tokyo, Japan

[73] Assignee: Kokusai Electric Co., Ltd., Tokyo, Japan

[21] Appl. No.: 906,066

[22] Filed: Aug. 5, 1997

Related U.S. Application Data

[63] Continuation of Ser. No. 433,087, May 3, 1995, abandoned.

[30] Foreign Application Priority Data

May 12, 1994 [JP] Japan .................................. 6-123047
Mar. 28, 1995 [JP] Japan .................................. 7-094381

[51] Int. Cl.[6] .................................................. B65G 49/07
[52] U.S. Cl. ......................... 414/217; 414/416; 414/937; 414/939
[58] Field of Search .................................. 414/217, 416, 414/937, 939, 940

[56] References Cited

U.S. PATENT DOCUMENTS

| 5,121,705 | 6/1992 | Sugino ............................ 414/217 X |
| 5,178,639 | 1/1993 | Nishi .................................. 414/940 X |
| 5,221,201 | 6/1993 | Yamaga et al. ..................... 414/940 X |
| 5,261,935 | 11/1993 | Ishii et al. ........................... 414/937 X |
| 5,273,423 | 12/1993 | Shiraiwa ............................. 414/937 X |
| 5,277,579 | 1/1994 | Takanabe ............................ 414/939 X |
| 5,303,671 | 4/1994 | Kondo et al. ....................... 414/937 X |
| 5,409,348 | 4/1995 | Suzuki ................................ 414/416 X |
| 5,433,785 | 7/1995 | Saito .................................. 414/939 X |
| 5,462,397 | 10/1995 | Iwabuchi ............................ 414/940 X |
| 5,464,313 | 11/1995 | Ohsawa .............................. 414/940 X |
| 5,562,383 | 10/1996 | Iwai et al. ............................. 414/217 |

Primary Examiner—James W. Keenan
Attorney, Agent, or Firm—Graham & James LLP

[57] ABSTRACT

A semiconductor manufacturing equipment, which comprises a boat elevator installed below a reaction chamber for loading a boat into the reaction chamber, cassette stocker installed opposite to the boat elevator, a wafer carrier installed between the cassette stocker and the boat elevator and used for transferring wafers between the cassette stocker and the boat, and a load-lock chamber for accommodating the boat elevator, whereby wafers are carried in the atmospheric air within the semiconductor manufacturing equipment, and the transport time is set in such manner that an increase of a natural oxide film formed on the wafers is 2 angstroms or less.

12 Claims, 5 Drawing Sheets

FIG.6
PRIOR ART ic equipment for manufacturing semiconductor by
SEMICONDUCTOR MANUFACTURING EQUIPMENT AND METHOD FOR CARRYING WAFERS IN SAID EQUIPMENT This is a continuation of application Ser. No. 08/433,087 filed on May 3, 1995, now abandoned.

BACKGROUND OF THE INVENTION

The present invention relates to a semiconductor manufacturing equipment for manufacturing semiconductor by forming a thin film on silicon wafers, and in particular to a diffusion or a CVD (chemical vapor deposition) equipment provided with a vertical furnace.

With rapid technical progress in a semiconductor device with higher degree of integration in recent years, there are strong demands to produce as a thin natural oxide film as possible on a wafer surface. Particularly, in the device of 16 Mbit DRAM or more, it is essential that the thickness of the natural oxide film is 5 angstroms or thinner.

One type of the semiconductor manufacturing equipment to suppress formation of such natural oxide film is a load-lock type diffusion equipment or a vertical type CVD equipment.

Figure 6:
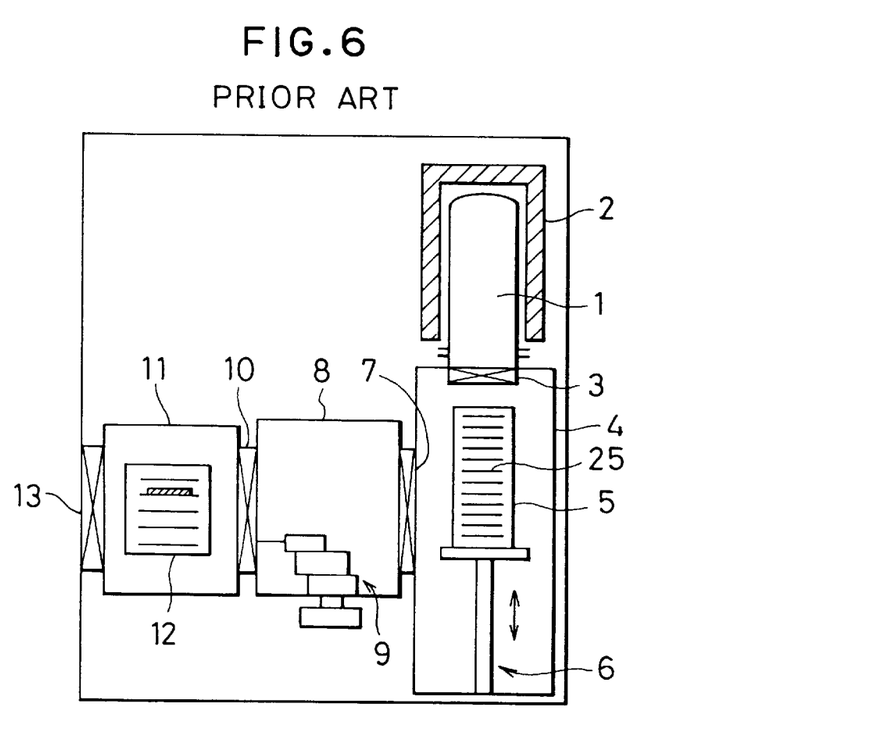
FIG. 6 represents a schematical drawing of a conventional type equipment.

FIG. 6 schematically represents a conventional load-lock vertical type CVD equipment.

This vertical type CVD equipment has a reaction chamber 1 in an upper backside portion of the equipment, and the reaction chamber 1 and its interior are heated by a heater 2, which surrounds the reaction chamber 1. On the lower end of the reaction chamber 1, an airtight load-lock chamber 4 is airtightly connected via a gate valve 3. In the load-lock chamber 4, a boat elevator 6 for loading and unloading a boat 5 to and from the reaction chamber 1 is installed. On the forward side of the load-lock chamber 4, an airtight wafer carrying chamber 8 is airtightly connected via a gate valve 7, and a wafer carrier 9 is provided in the wafer carrying chamber 8. Further, in the wafer carrying chamber, an airtight cassette accommodation chamber 11 is airtightly connected via a gate valve 10, and wafer cassettes 12 can be accommodated in the cassette accommodation chamber 11. On the cassette accommodation chamber 11, a gate valve 13 serving as an outlet and an inlet to and from the outside of the equipment is installed, and the wafer cassettes 12 are brought into and out of the cassette accommodation chamber 11 via the gate valve 13.

To each of the load-lock chamber 4, the wafer carrying chamber 8, and the cassette accommodation chamber 11, a nitrogen gas supply line (not shown) and an exhaust line (not shown) are connected. The load-lock chamber 4, the wafer carrying chamber 8, and the cassette accommodation chamber 11 can be evacuated to vacuum and the air in each of these chambers can be replaced with nitrogen.

In the above CVD equipment, when wafers 25 are loaded into the reaction chamber 1, the load-lock chamber 4 and the wafer carrying chamber 8 are filled with nitrogen gas in advance, and the wafer cassettes 12 are brought in by opening the gate valve 13. Then, the gate valve 13 is closed, and the air in the cassette accommodation chamber 11 is replaced with nitrogen gas, and it is turned to nitrogen gas atmosphere in the same way as the load-lock chamber 4 and the wafer carrying chamber 8.

The gate valves 10 and 7 are opened, and wafers 25 of the wafer cassette 12 are carried up to the load-lock chamber 4 by the wafer carrier 9, and the wafer is transferred to the boat 5 by horizontal transfer operation of the wafer carrier 9 and vertical moving of the boat 5 by means of the boat elevator 6.

In case wafers are to be processed, wafers to be produced, i.e. process wafers, and other various types of wafers such as dummy wafers and monitor wafers, are loaded into the boat 5 at the same time. If it is supposed that 100 process wafers are processed in a single operation, 25 wafers are normally accommodated in a wafer cassette. Accordingly, for a single processing, 4 cassettes are required for the process wafers, and one cassette each is required for the dummy wafers and the monitor wafers, thus requiring 6 cassettes in all.

Thus, there are different types of the cassette accommodation chambers 11 with different capacities, i.e. the cassette accommodation chamber for accommodating 6 wafer cassettes and the one for accommodating 1 or 2 wafer cassettes.

The conventional vertical type CVD equipment as described above comprises three airtight chambers, i.e. the load-lock chamber 4, the wafer carrying chamber 8, and the cassette accommodation chamber 11. Because the air in each of these chambers must be replaced with nitrogen gas, complicated mechanism is needed for a nitrogen gas supply system and an exhaust system, thereby increasing manufacturing cost of the equipment.

Further, in the cassette accommodation chamber 11 for accommodating 6 wafer cassettes, a transport operation of the wafer cassette 12 to and from the cassette accommodation chamber 11 and a replacement operation with nitrogen can be done in a single operation, while a mechanism must be furnished for transferring shelves to place the wafer cassettes 12 in the cassette accommodation chamber 11 so that the wafer carrier 9 can have access to all of the wafer cassettes 12. For this reason, a cassette accommodation chamber 11 of extremely large size is required to accommodate 6 wafer cassettes 12 and to accommodate the above transfer mechanism. As a result, a more complicated structure is needed for the system. Further, particles may be generated from the above transfer mechanism, and this is not desirable in the manufacture of a semiconductor device, which requires clean atmosphere. Further, because a large inner volume is needed for the cassette accommodation chamber 11, longer time is required for the gas replacement.

In the cassette accommodation chamber 11 for accommodating 1 or 2 wafer cassettes, the volume of the cassette accommodation chamber 11 is small, and the time required for the gas replacement may be shorter. No transfer mechanism is required, and no particles are generated, while capacity of the wafer cassette 12 is not sufficient to accommodate wafers of the boat 5. In this respect, to load as many wafers as planned to the boat 5, the wafer cassette 12 must be carried into and out of the cassette accommodation chamber 11 by many times, and the nitrogen gas replacement in the cassette accommodation chamber 11 must be repeated by many times until the boat 5 is filled with the whole wafers as planned. The time required for the nitrogen gas replacement exerts an extensive influence on the improvement of throughput. For example, the time of about 70 minutes are required for the vertical type CVD equipment as described. Therefore, it is essential that the time for the nitrogen gas replacement in the cassette accommodation chamber 11 is reduced to improve the throughput for wafer processing.

As the means for reducing the time for the nitrogen gas replacement, it is effective to design the cassette accommodation chamber 11 as small as possible. However, designing a smaller cassette accommodation chamber 11 means a limitation in the number of the wafer cassettes 12 to be accommodated. This results in more replacement operations for the cassette accommodation chamber 11 and does not contribute to the reduction of replacement time.

Further, in the conventional vertical type CVD equipment, wafers are transferred to the boat 5 by a horizontal transfer operation of the wafer carrier 9 and a vertical moving of the boat 5 by the boat elevator 6, i.e. the wafers are transferred from the boat 5 one, after another from above. Therefore, when it is advanced to the stage where wafer is transferred from lower portion of the boat 5, the upper portion of the boat 5 is brought into the reaction chamber 1. As a result, the wafers 12 transferred earlier is heated in the reaction chamber 1, and this causes temperature difference between the upper wafers and the lower wafers to be transferred later. In this connection, it has been practiced conventionally that, after all wafers have been transferred to the boat 5 and the boat 5 is loaded into the reaction chamber 1, preheating time must be set to equalize the temperature of all wafers, or that the temperature of the reaction chamber 1 is decreased when wafers are transferred. In both of these cases, however, much time is required until actual processing is started, and this results in the decrease of throughput.

SUMMARY OF THE INVENTION

It is an object of the present invention to simplify the structure of a load-lock vertical type semiconductor manufacturing equipment, to reduce the manufacturing cost of the equipment itself and to improve throughput, to reduce contamination of wafers due to particles, and to improve the product quality of the semiconductor device.

To attain the above object, the semiconductor manufacturing equipment according to the present invention comprises a boat elevator installed below a reaction chamber for loading a boat to the reaction chamber, cassette receiving means installed opposite to the boat elevator, a wafer carrier installed between the cassette receiving means and the boat elevator and movable up and down for transferring the wafers between the cassette receiving means and the boat, and a load-lock chamber for accommodating the boat elevator, whereby the transfer of wafers in the semiconductor manufacturing equipment is performed in atmospheric air, and transfer time is set in such manner that the increase of natural oxide film formed on the surface of the wafers is 2 angstroms or less.

DETAILED DESCRIPTION OF THE PREFERRED EMBODIMENTS

In the following, description will be given on an embodiment of the present invention in connection with the drawings.

Figure 5:
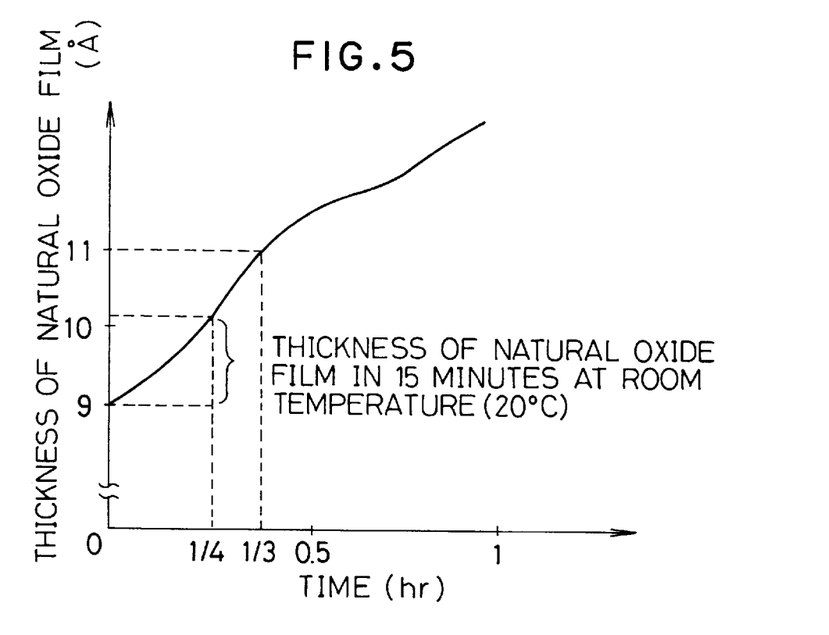
FIG. 5 is a diagram showing the formation of a natural oxide film on a wafer at room temperature.

First, the present inventors observed and studied the oxidation of wafers exposed to the atmospheric air, not at a high temperature, i.e. at the room temperature (20° C.), and the data were recorded. FIG. 5 is a diagram showing a growth of a natural oxide film to be formed on the surface of a wafer at a temperature of 20° C . From the observation of the wafer oxidation by the present inventors, it was found that the increase in thickness of the natural oxide film is about 1 angstrom when the wafers were exposed to atmospheric air for about 15 minutes. It was also confirmed in the experiment by the present inventors that the increase of the natural oxide film up to about 2 angstroms causes no problem in the practical application.

The present invention has been conceived by taking special notice of the natural oxidation status of the wafers.

Figure 1:
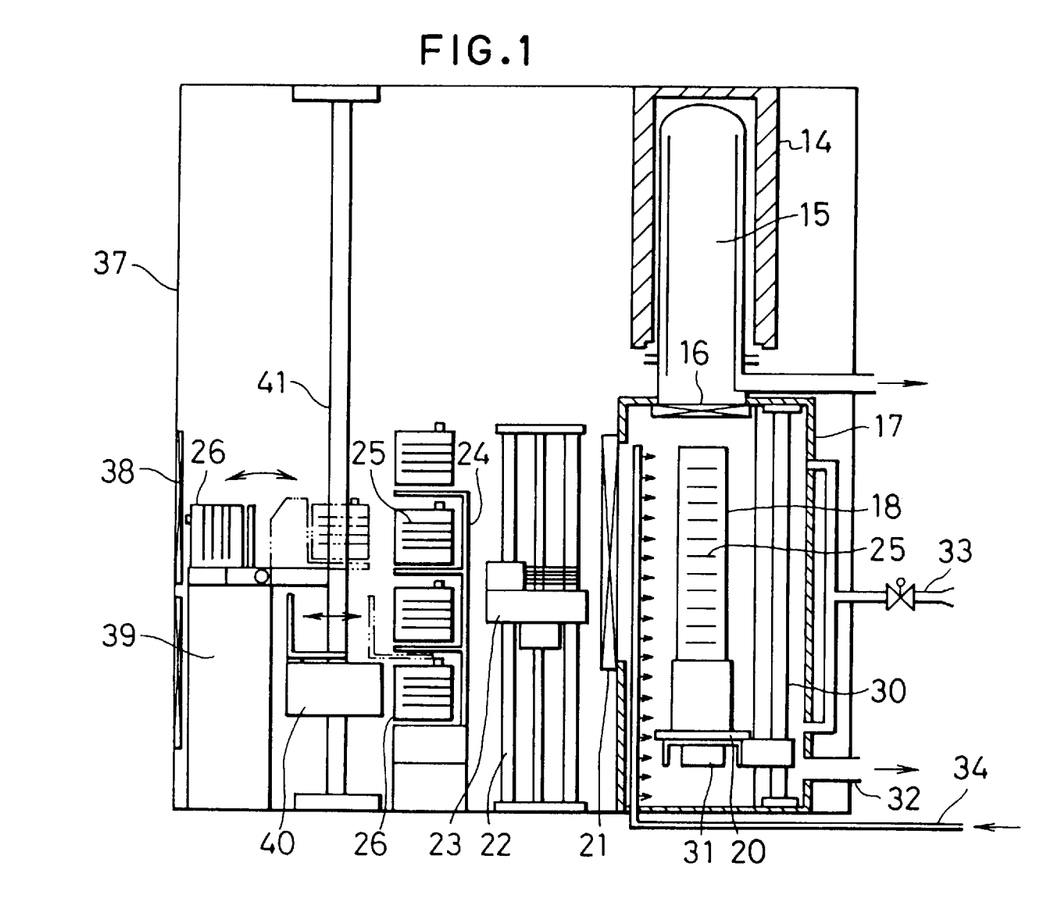
FIG. 1 is a schematical drawing of an embodiment of the present invention.

Description is now given on a first embodiment of the present invention referring to FIG. 1.

On the lower end of a reaction chamber 15 surrounded by a heater 14, a load-lock chamber 17 is airtightly connected via a gate valve 16. Inside the load-lock chamber 17, a boat elevator 30 is installed for loading and unloading a boat 18 into and from the reaction chamber 15. The boat 18 is supported by the boat elevator 30 via a boat receptacle 20, and the boat receptacle 20 can block airtightly the lower opening of the reaction chamber 15.

The boat 18 can be loaded into or unloaded from the reaction chamber 15 by the boat elevator 30, and the boat elevator 30 has a rotating mechanism 31 for the boat 18 to rotate the boat 18 in the reaction chamber 15 during wafer processing, and this ensures uniform processing on the wafer surface. Exhaust lines 32, 33 and a nitrogen gas supply line 34 are communicated with the load-lock chamber 17, and the load-lock chamber 17 can be evacuated to vacuum and the nitrogen gas replacement can be performed therein.

On the forward side of the load-lock chamber 17, a gate valve 21 is mounted, which has an opening of approximately the same height as total height of the boat 18 so that wafers can be loaded to the boat 18 in the descent condition at any position without moving the boat 18 up and down. A carrying elevator 22 is installed face-to-face to the boat elevator 30 with the gate valve 21 therebetween, and the carrying elevator 22 is provided with a wafer carrier 23. The wafer carrier 23 can be moved up and down by the carrying elevator 22, and it can be rotated around a vertical axis and can be moved back and forth in the horizontal direction. Also, the wafer carrier 23 can transfer as many wafers as desired, e.g. 5 wafers, at one time, and a wafer holder (not shown) is designed in such manner that its pitch can be changed to match the difference of a wafer accommodating pitch of the wafer cassette and a wafer accommodating pitch of the boat 18. Further, a cassette stocker 24 is provided at the wafer transfer position opposite to the carrying elevator 22, and the cassette stocker 24 has a plurality of rows of the wafer cassette accommodation shelves.

In front of an enclosure 37, a front shutter 38 is provided, which can be opened and closed by moving up and down, and adjacent to the front shutter 38, a cassette stage 39 is installed, and a cassette elevator 41 is arranged between the cassette stage 39 and the cassette stocker 24. The cassette elevator 41 is provided with a cassette transfer unit 40, which can be moved up and down. When a wafer cassette 26 is carried onto the cassette stage 39 via the front shutter 38, it is turned by about 90 degrees by the cassette stage 39. As the cassette transfer unit 40 is moved up and down or back and forth, the wafer cassette 26 is transferred to the cassette stocker 24. Further, the transfer of the wafer cassette from the cassette stocker 24 to the cassette stage 39 is performed via the cassette transfer unit 40.

Next, the operation of the equipment is described.

The boat 18 is moved down by the boat elevator 30, and the gate valve 16 closes the reaction chamber 15. The gate valve 21 is turned to closed state.

The wafer cassette 26 with the wafer 25 loaded thereon is accommodated into the cassette stocker 24 via the cassette transfer unit 40, and the gate valve 21 is opened. By the coordinated operation of the wafer carrier 23 and the carrying elevator 22, the wafer 25 is taken out from the wafer cassette 26 on the cassette stocker 24 from above, and the wafers 25 are loaded to the boat 18. The transfer of the wafers 25 from the cassette stocker 24 to the boat 18 is carried out in the atmospheric air.

The above transfer operation is repeated, and all wafers 25 are loaded to the boat 18 as planned. The time required up to the completion of the transfer of 100 wafers 25 to the boat 18 is about 15 minutes.

As described above, when the wafers 25 are left at the room temperature for 15 minutes, the increase of a natural oxide film is about 1 angstrom, and such increase gives no substantial effect on the production of the product.

When the loading has been completed, the gate valve 21 is closed, and the air in the load-lock chamber 17 is replaced with nitrogen gas by a nitrogen gas supply line 34 and exhaust lines 32, 33. After waiting (about 30 minutes) until the concentration of air in the load-lock chamber 17 is about 1 ppm, the gate valve 16 is opened when the value to be aimed has been reached. The boat 18 is moved up by the boat elevator 30, and wafers 25 are loaded into the reaction chamber 15. When the boat 18 is completely loaded, the reaction chamber 15 is blocked by the boat receptacle 20. The reaction chamber 15 is heated by the heater 14, and a film is formed on the surface of the wafers 25.

When the processing of the wafers in the reaction chamber 15 has been completed, the wafers 25 are carried to the cassette stocker 24 by reversing the above procedure, and the wafer cassette 26 is taken out, thus completing a cycle of processing operation.

Figure 2:
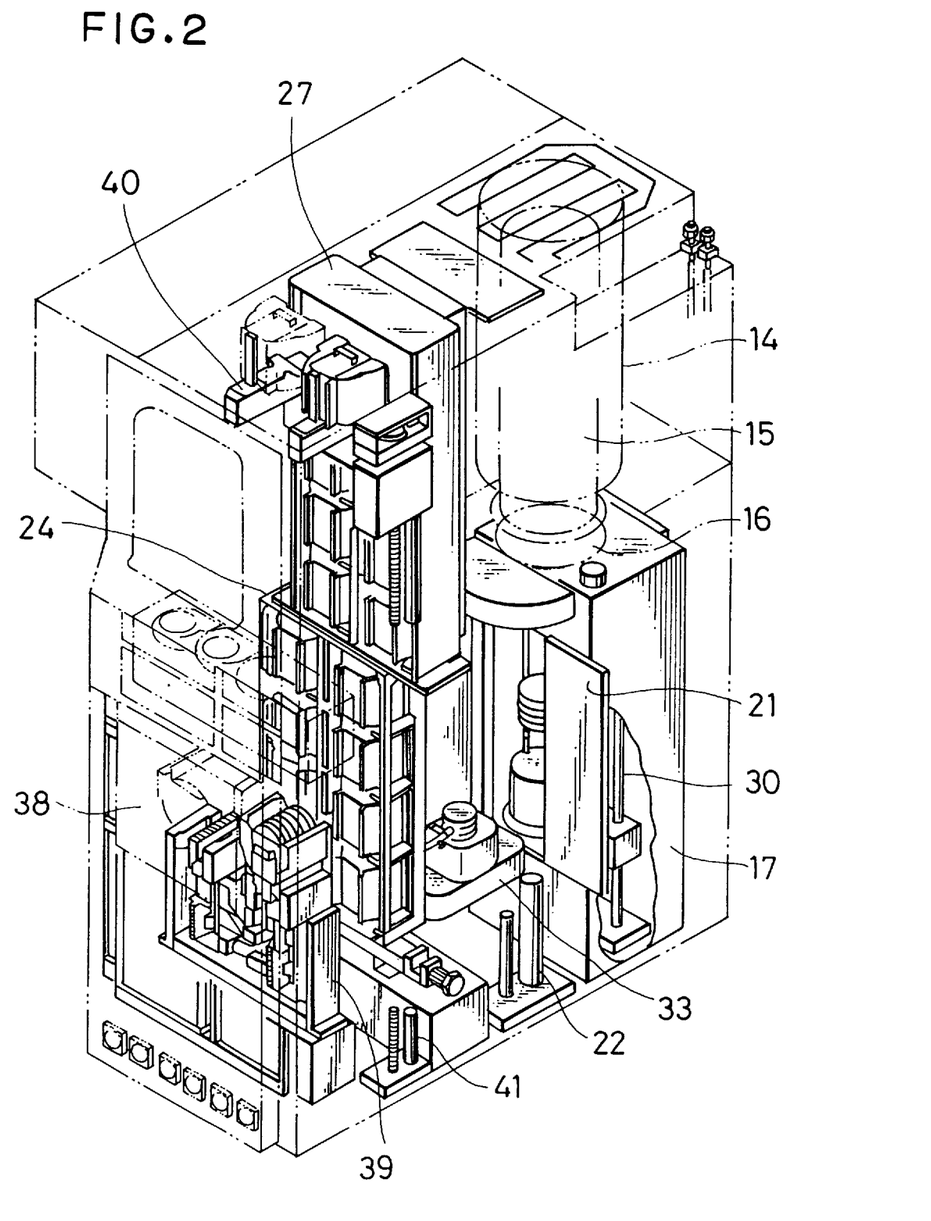
FIG. 2 is a perspective view of another embodiment of the present invention.
Figure 3:
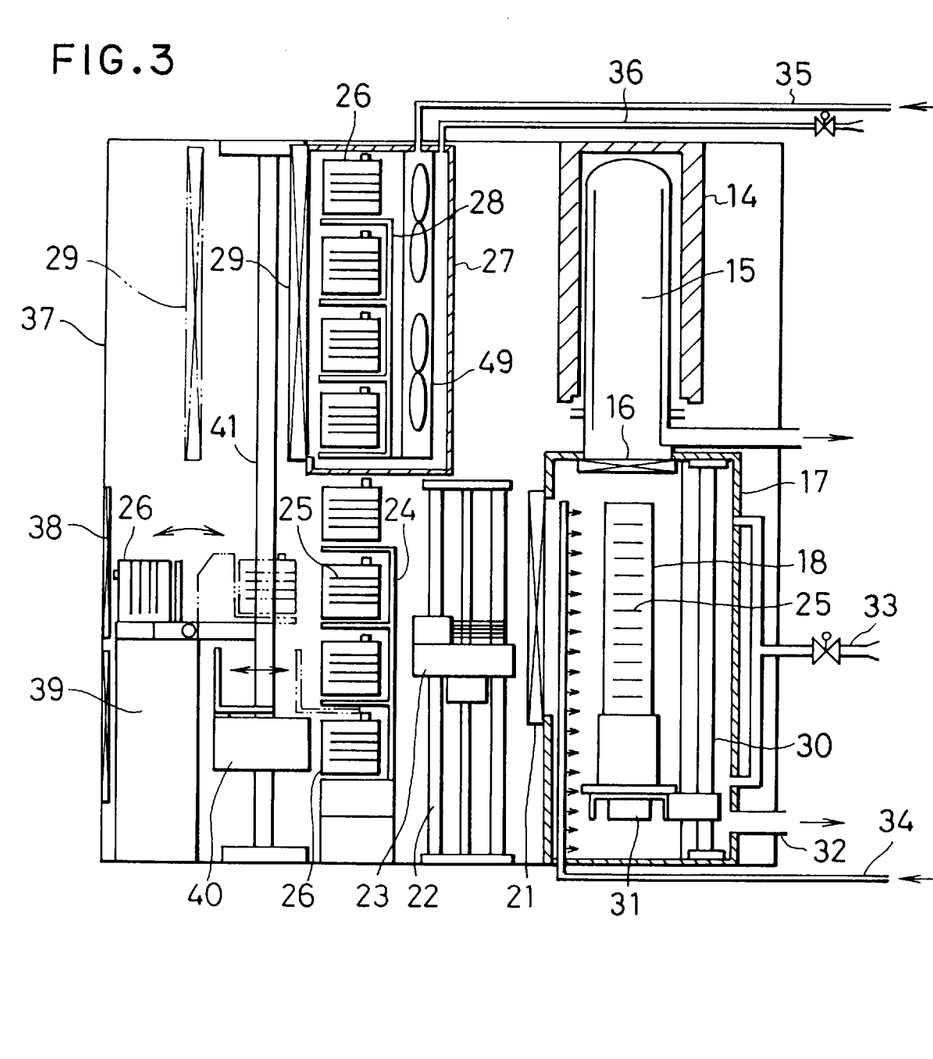
FIG. 3 is a schematical drawing of the above embodiment.

Description is now given on another embodiment referring to FIGS. 2 and 3. In FIG. 2. the same component as in FIG. 1 is referred by the same symbol.

A boat elevator 30 is installed in the load-lock chamber 17, and the boat 18 can be loaded into or unloaded from the reaction chamber 15 by the boat elevator 30, and the boat elevator 30 has a rotating mechanism 31 to rotate the boat 18 in the reaction chamber 15 during wafer processing, and this ensures uniform processing on the wafer surface. The load-lock chamber 17 is communicated with exhaust lines 32, 33 and a nitrogen gas supply line 34.

A preliminary accommodation chamber 27 is arranged above the cassette stocker 24, and a buffer cassette stocker 28 is provided inside the preliminary accommodation chamber 27. In the preliminary accommodation chamber 27, a cover 29 movable in the forward direction and openable as shown by two-dot chain line in FIG. 3 is provided so that the cassette can be carried in and out. Further, at the deepest portion of the buffer cassette stocker 28, a clean unit 49 is provided to produce clean air flows in the buffer cassette stocker 28. The preliminary accommodation chamber 27 is communicated with a nitrogen gas supply line 35 and an exhaust line 36 so that the atmosphere inside can be replaced with nitrogen gas.

In front of an enclosure 37, a front shutter 38 is arranged, which can be opened or closed by moving up and down. Adjacent to the front shutter 38, a cassette stage 39 is disposed, and a cassette elevator 41 is arranged between the cassette stage 39 and the cassette stocker 24. The cassette elevator 41 is provided with a cassette transfer unit 40, which can be moved up and down.

When carried onto the cassette stage 39 via the front shutter 38, the wafer cassette 26 is turned by about 90 degrees by the cassette stage 39. By moving the cassette transfer unit 40 up and down or back and forth, the wafer cassette 26 is transferred to the cassette stocker 24 or to the preliminary accommodation chamber 27. Further, the transfer of the wafer cassette from the preliminary accommodation chamber 27 to the cassette stocker 24 or from the cassette stocker 24 to the cassette stage 39 is performed via the cassette transfer unit 40.

The wafer cassette with the wafer loaded thereon is accommodated into the buffer cassette stocker 28. By loading the wafer cassette 26 of the next process into the buffer cassette stocker 28, an interference is avoided between the carrying operation of the wafer cassette from outside to the semiconductor equipment and the wafer transfer operation between the cassette stocker 24 and the boat 18. Thus, waiting time in the wafer carrying operation is eliminated, and throughput is improved.

The time for accommodating wafers in the preliminary accommodation chamber 27 is as long as the time for about one batch. Thus, during waiting the accommodation in the preliminary accommodation chamber 27, the air inside is evacuated by the exhaust line 36. Further, nitrogen gas is supplied by the nitrogen gas supply line 35, and the air is replaced with nitrogen gas to prevent natural oxidation of the wafers.

Because the cassette stocker 24 is not accommodated in an airtight chamber in the present embodiment, the preliminary accommodation chamber 27 to accommodate the buffer cassette stocker 28 can be easily installed, and the transfer of the wafer cassette between the buffer cassette stocker 28 and the cassette stocker 24 can be performed in easier manner without requiring a complicated sequence of the operations.

Figure 4:
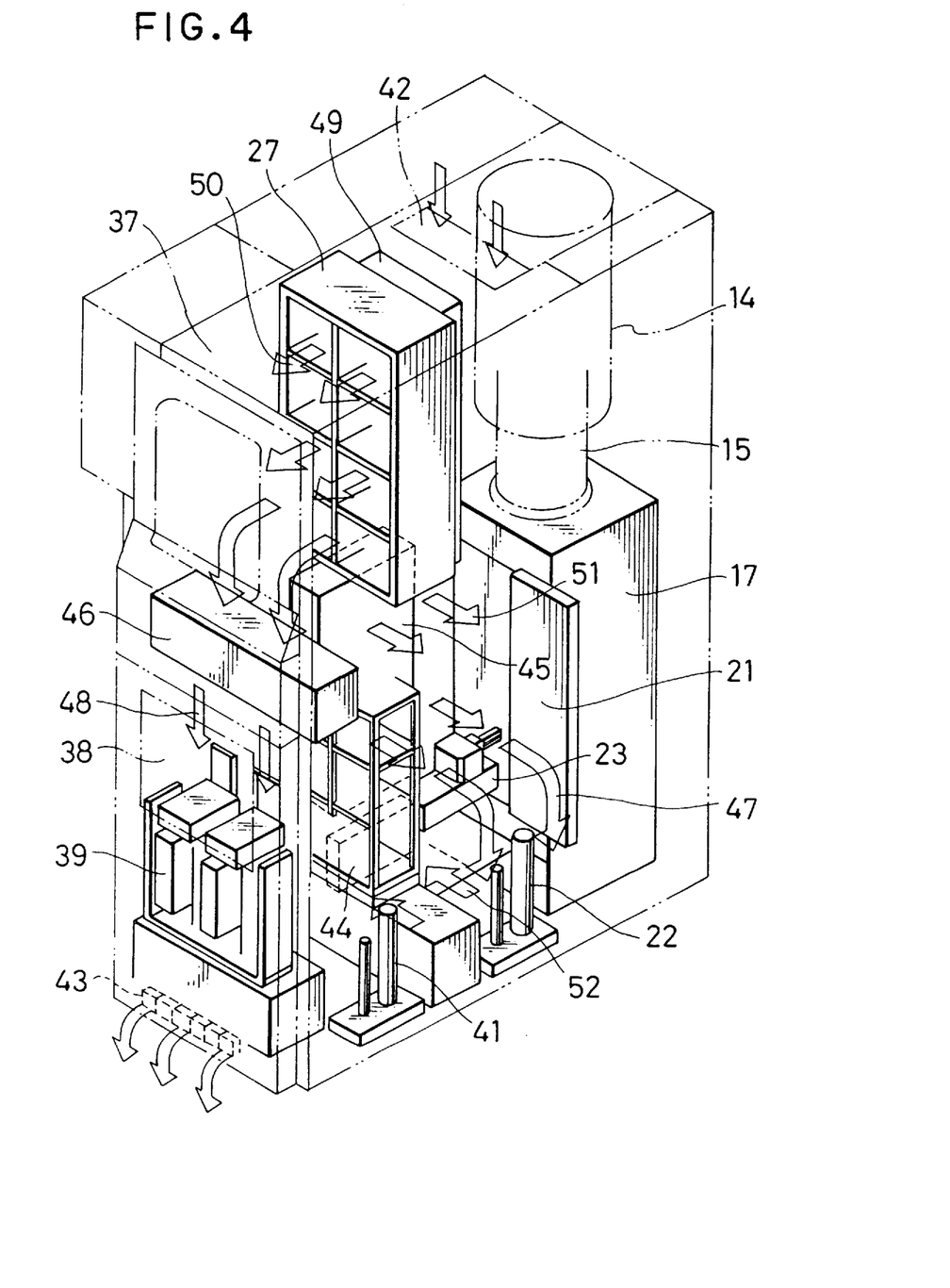
FIG. 4 is a perspective view showing the flows of clean air in the above embodiment.

Next, description will be given on the flows of clean air in the equipment referring to FIG. 4.

On the top surface of the enclosure 37, an air inlet is provided, and an air filter 42 is arranged at the air inlet. An exhaust unit 43 is arranged on the lower portion of the cassette stage 39, and an exhaust unit 44 is arranged on the lower portion opposite to the carrying elevator 22. Further, a clean unit 49 is provided on the backside of the preliminary accommodation chamber 27, a clean unit 45 is provided above the exhaust unit 44, and a clean unit 46 is provided on the upper portion of the front shutter 38.

Sucked through an air filter 42, the air is sent out from the clean unit 49, and a uniform flow 50 is generated. Further, the air is sent out from the clean unit 46 downward and a uniform flow 48 is generated, which is discharged from the exhaust unit 43.

On the side of the equipment closer to the clean unit 45, an air inlet is provided, and an air filter (not shown) is mounted at the air inlet. The air sucked through the air filter is sent out from the clean unit 45. By the clean air thus sent out, a uniform flow 51 is formed in a space, in which the mechanisms such as the wafer carrier 23 are included, and the uniform flow 51 is turned to uniform flows 47 and 52, which are deflected and are sent into the space defined by a partition plate (not shown) installed on the lower portion of the wafer carrier. The mechanisms such as the carrying elevator 22 are arranged downstream, and generated particles are discharged through the exhaust unit 44 together with the uniform flows 51, 47 and 52 without contaminating inside the equipment. Thus, a contamination of the wafers by the particles is prevented. The uniform flow 48 prevents the external air from entering into the equipment even when the front shutter 38 is opened, and this prevents the contamination with the external air inside the equipment.

In the above embodiment, there are two different ways for the nitrogen gas replacement: to discharge the air from the chamber and to supply nitrogen gas, and to evacuate the chamber to vacuum and to supply nitrogen gas, and this should be selected as appropriate. Also, the replacing gas is not limited to nitrogen gas, and inert gas such as argon gas may be used. It is needless to say that the transfer time in the atmospheric air is changed according to a temperature, and it should be adjusted in such manner that the transfer is completed until the increase of a natural oxide film reaches about 2 angstroms, i.e. in about 20 minutes. Further, the cassette stocker may be any cassette receiving means having the function to receive the wafer cassette. Therefore, it may be a simple wafer cassette receiver.

As described above, the present invention relates to a system, which allows the increase of a natural oxide film as far as no hindrance occurs in practical application. There is only one airtight chamber and the structure is simple, and the sequence of operations is also simple. The nitrogen gas replacement is performed only once for the load-lock chamber. Thus, the transfer cycle time can be extensively reduced, and throughput can be improved. Because only one airtight chamber is required, it is possible to simplify the nitrogen gas supply and discharge line, and to reduce the manufacturing cost of the semiconductor manufacturing equipment. In case wafers are transferred to the boat, there is no need to move the boat up, and this eliminates the problem of the temperature difference among wafers. Because uniform flows are provided within the equipment, the contamination of the wafers with particles can be extensively reduced.

What we claim is:

1. A semiconductor manufacturing apparatus disposed within an oxygen containing atmosphere comprising:
    a reaction chamber;
    a load lock chamber disposed below said reaction chamber and forming an isolated space from said atmospheres, said load lock chamber having a first opening and a second opening;
    an elevator disposed within said load lock chamber;
    a boat attached to said elevator and movable between said load lock chamber and said reaction chamber through said first opening, wherein the height of said second opening is greater than or approximately equal to the height of said boat;
    a cassette stocker disposed externally to said load lock chamber;
    a wafer carrier disposed opposite said elevator and adapted to individually transfer wafers directly between a cassette within said cassette stocker and said boat on said elevator within said load lock chamber through said second opening; and
    a first load lock gas line in communication with said load lock chamber and a second load lock gas line in communication with said load lock chamber, wherein said first load lock has line is an exhaust line and said second load lock gas line is a replacement gas supply line.

2. The apparatus of claim 1 further comprising:
    a front opening adapted to receive cassettes;
    a preliminary accommodation chamber;
    a cassette transfer unit adapted to transfer a cassette between said front opening, said preliminary accommodation chamber, and said cassette stocker.

3. The apparatus of claim 2 further comprising:
    a first accommodation gas line in communication with said preliminary accommodation chamber.

4. The apparatus of claim 3 further comprising a second accommodation gas line in communication with said preliminary accommodation chamber, and wherein said first accommodation gas line is an exhaust line, and said second accommodation gas line is a replacement gas supply line.

5. The apparatus of claim 1, wherein said wafer carrier moves in a vertical direction, rotates and translates on a horizontal plane, and is configured to access the full length of the boat disposed within said load lock chamber; and
    wherein the wafers are transferred between one or more cassettes and the boat by said wafer carrier such that the increase in natural oxide film which is formed on the wafers is less than about 2 Å.

6. The apparatus of claim 1, wherein said wafer carrier moves in a vertical direction, rotates and translates on a horizontal plane, and is able to access the full length of the boat disposed within said load lock chamber; and
    wherein the wafers are transferred between one or more cassettes and the boat by said wafer carrier within a 20 minute duration.

7. A semiconductor manufacturing apparatus disposed within an oxygen containing atmosphere comprising:
    a reaction chamber;
    a load lock chamber disposed below said reaction chamber and forming an isolated space from said atmosphere, said load lock chamber having a first opening and a second opening;
    a boat disposed within said load lock chamber, wherein the height of said second opening is greater than or approximately equal to the height of said boat;
    elevator means disposed within said load lock chamber for moving said boat between said load lock chamber and said reaction chamber through said first opening;
    cassette receiving means disposed within said atmosphere;
    wafer carrying means, disposed opposite said elevator means, for individually moving wafers directly between a cassette within said cassette receiving means and said boat on said elevator within said load lock chamber through said second opening; and
    evacuation means for evacuating said ambient atmosphere from said load lock chamber, said evacuation means including gas supply means for supplying a replacement gas to said load lock chamber.

8. The apparatus of claim 7 further comprising:
    a front opening for receiving cassettes;
    a preliminary accommodation chamber;
    cassette transfer means for transferring a cassette between said front opening, said preliminary accommodation chamber, and said cassette receiving means.

9. The apparatus of claim 8 further comprising second evacuation means for evacuating said preliminary accommodation chamber.

10. The apparatus of claim 9 wherein said second evacuation means includes gas supply means for supplying a replacement gas to said preliminary accommodation chamber.

11. The apparatus of claim 7, wherein said wafer carrier moves in a vertical direction, rotates and translates on a horizontal plane, and is configured to access the full length of the boat disposed within said load lock chamber; and wherein the wafers are transferred between one or more cassettes and the boat by said wafer carrier such that the increase in natural oxide film which is formed on the wafers is less than about 2 Å.

12. The apparatus of claim 7, wherein said wafer carrier moves in a vertical direction, rotates and translates on a horizontal plane, and is able to access the full length of the boat disposed within said load lock chamber; and wherein the wafers are transferred between one or more cassettes and the boat by said wafer carrier within a 20 minute duration.

* * * * *